United States Patent [19]

Sireul et al.

[11] Patent Number: 4,755,754

[45] Date of Patent: Jul. 5, 1988

[54] DEVICE TO FASTEN AND ADJUST A MANDREL FOR HOLDING GRADIENT COILS

[75] Inventors: Jacques Sireul, Wissous; Claude Prevot, Antony; Bernard Rigeade, Rambouillet, all of France

[73] Assignee: Thomson-CGR, Paris, France

[21] Appl. No.: 37,730

[22] Filed: Apr. 13, 1987

[30] Foreign Application Priority Data

Apr. 15, 1986 [FR] France ............... 86 05364

[51] Int. Cl.[4] ............... G01R 33/20
[52] U.S. Cl. ............... 324/318; 335/216
[58] Field of Search ............... 335/257, 216; 333/219; 324/300, 307, 318, 319, 320, 322

[56] References Cited

U.S. PATENT DOCUMENTS

| | | | |
|---|---|---|---|
| 3,613,006 | 10/1971 | Kautrowitz | 335/216 |
| 3,980,981 | 9/1976 | Boom | 335/216 |
| 4,093,912 | 6/1978 | Double | 324/320 |
| 4,506,240 | 3/1985 | Shores | 333/219 |
| 4,599,592 | 7/1986 | Marsing | 335/216 |
| 4,622,531 | 11/1986 | Eyssa | 335/216 |
| 4,652,824 | 3/1987 | Oppelt | 335/216 |

FOREIGN PATENT DOCUMENTS 0152588 8/1985 European Pat. Off. .
2557351 6/1985 France .

OTHER PUBLICATIONS

Patents Abstracts of Japan, vol. 9, No. 86, (P-349)[1809], Apr. 16, 1985; & JP-A-59 216 015, (Hitachi Seisakusho K. K.), 06-12-1984.

Primary Examiner—Michael J. Tokar
Attorney, Agent, or Firm—Oblon, Fisher, Spivak, McClelland & Maier

[57] ABSTRACT

A mandrel for holding gradient coils in an instrument that measures nuclear magnetic resonance is fastened directly to the magnet of this instrument. It is shown that this arrangement can be used to reduce the output of noise while, at the same time, making it easy to adjust the position of the mandrel. The device comprises two sets of brackets fastened by their struts, on either side of the magnet, to the end rings of the magnet. Each bracket exerts a holding force on the mandrel.

8 Claims, 2 Drawing Sheets

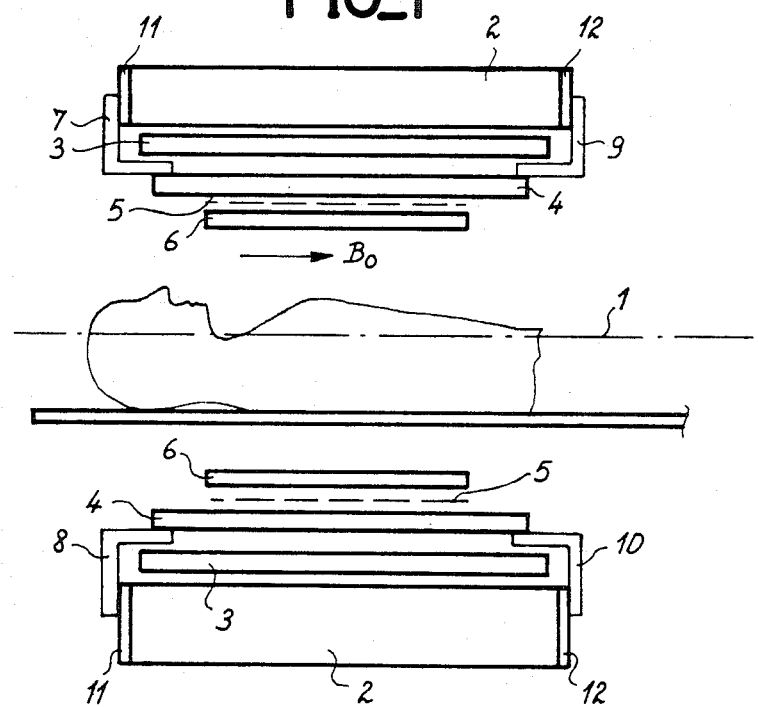
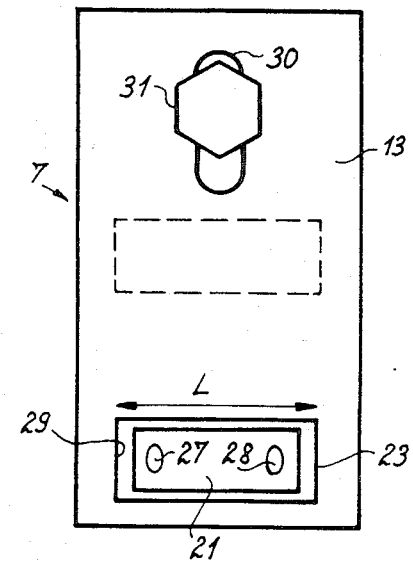

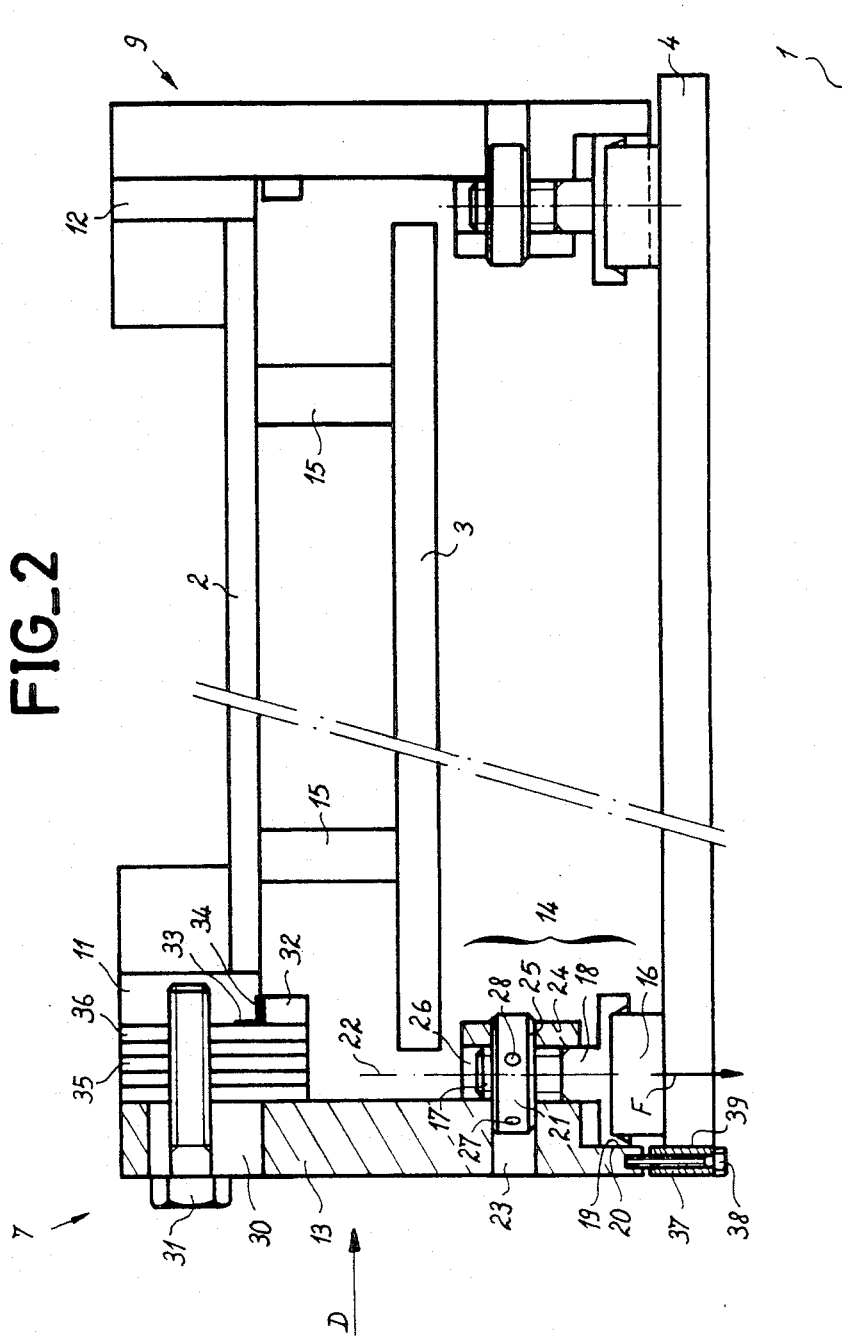

DEVICE TO FASTEN AND ADJUST A MANDREL FOR HOLDING GRADIENT COILS

BACKGROUND OF THE INVENTION

The invention pertains to a device for fastening and adjusting a mandrel used to hold gradient coils inside the magnet of an instrument for measurement by nuclear magnetic resonance. Its special application is in medicine, where large-sized magnets and gradient-coil-holding mandrels are used. Among these measuring instruments, the invention pertains especially to those intended for nuclear magnetic resonance imaging (NMRI) on human bodies.

FIELD OF THE INVENTION

An instrument for the measurement of nuclear magnetic resonance comprises essentially a magnet used to subject a body to be examined to an intense and homogeneous, direct magnetic field $B_0$. This magnet generally has a circular, cylindrical shape. The typical length of this cylinder is a few meters (2.5 mm.), leaving an unoccupied, circular, cylindrical, internal volume of examination, the diameter of which is about 1 meter. The homogeneity of the field is ordinarily corrected by adding on adjusting coils, called shim coils, which are positioned concentrically to the magnet and inside it, but as near as possible to the inner surface of this magnet. Thus, a greater volume of examination is left unoccupied. To differentiate the regions of the volume of examination, especially to carry out imaging, a method used in the prior art is to place a mandrel holding so-called gradient coils inside the shim coils. The gradient coils introduce a disturbance, which is graduated, of the field, and the distribution of this field, in relation to axes of measurement, is known. The mandrel, known as a gradient-coil-holding gradient mandrel, is placed inside the entire set of shim coils. It leans on them. In the volume left unoccupied inside the gradient mandrel, there is also a radio-frequency antenna designed to cause a flip-over in the orientation of the magnetic moments of the particles of the body being examined. This flip-over is obtained by the transmission of an exciting pulse. The antenna is also used to measure the return-to-equilibrium signal transmitted by these particles when their magnetic moments tend to become realigned with the orienting field $B_0$. For a variety of reasons, the radio-frequency antennas placed inside the gradient mandrel are separated from it by a screen which tends to prevent the dampening of the radio-frequency pulse in the gradient coils. This dampening reduces the efficiency of the pulse. Without this screen, the pulse may, moreover, disturb the functioning of the gradient coils. Finally, in the space left unoccupied inside this concentric stacking, there is the body to be examined. Conventionally, for use in medicine, the effective cylindrical space available for the examination has a diameter slightly greater than 0.50 m.

DESCRIPTION OF THE PRIOR ART

Three of these means must have their concentricity set up with special care. These three means are the set comprising the shim coils, the gradient mandrel and the magnet. Owing to the concentricity, the method used in the prior art is to position each of the coils by using all the coils which surround it as a reference. Thus, the shim coils lean on the inside surface of the magnet, the gradient mandrel leans on the inside surface of the shim coils, the screen is placed flat against the inside surface of the gradient mandrel and, finally, the radio-frequency coils are hooked on after the screen. Practice has shown that this method has two disadvantages.

Firstly, during an NMR examination, the magnetic field gradients used are imposed in pulsed sequences. They are set up, they last for a few moments (a few milliseconds) and then they are turned off. The conductors of these gradient coils, which are subjected to currents of variable intensity when the current is set up and turned off and which, moreover, are bathed in a constant magnetic field (the orienting field $B_0$), are then subjected, according to Laplace's law, to stresses that tend to make them vibrate. These vibrations reverberate throughout the concentric chain and especially in the shim coils, the weight of which is roughly the same as that of the gradient mandrel. The result of this is that an NMR examination is a noisy operation. Noises of the order of even 90 dB may be recorded in certain cases. The vibrations are furthermore, transmitted up to the magnet itself, even though the latter weighs several tons, and stimulate it in a damaging way. In particular, if this magnet is a superconductor magnet, the result is an increase in the consumption of its refrigerant.

Furthermore, because of the stacking, when the various parts of the instrument are being installed and adjusted, any operation to adjust one of the parts causes a disturbance or modification in the adjustment of the position of the other parts. Now, the nature of the disturbance caused by the gradients is linear, along predetermined axes of measurement. It is thus generally accepted that the number of shimi coils is reduced by using the gradient coils as a first order of correction of the homogeneity of the orienting field. It quite simply suffices to make a direct current flow through these gradient coils, a gradient offset, the intensity of which depends on the correction to be obtained. The result of this is that the precision with which the position of the gradient mandrel is adjusted becomes a matter of vital importance since the gradient coils play a role in correcting the homogeneity of the orienting field. This gradient mandrel can thus be properly secured inside the shim coils only after long and painstaking mechanical adjustment.

The object of the invention is to remove the disadvantages referred to by eliminating the stacking of reference pieces and by proposing fastening means such that the gradient mandrel is supported directly on the magnet (and no longer on the set of interposed shim coils). Consequently, the transmission of mechanical vibrations from the gradient mandrel to the set of shim coils is eliminated. As a result, the shim coils no longer vibrate. Thus, the vibrating mass that shakes the magnet is lessened. It is reduced to the mass of the gradient mandrel. This causes the audible noise emitted and the amount of refrigerant consumed to be reduced. Furthermore, the adjusting of the various parts is improved. For every part is now supported on one and the same rigid reference piece, namely the magnet itself. Furthermore, the device for holding the gradient mandrel may then comprise a serially-arranged damper, specifically designed to dampen the intrinsic vibrations of the gradient mandrel. It is almost impossible, however, in the state of the art mentioned, to conceive of a damper to reduce the composite vibrations of the entire unit comprising the gradient mandrel and the shim coils.

The invention therefore pertains to a device for fastening and adjusting a gradient-coil-holding mandrel inside a broadly tube-shaped magnet of an instrument for measuring nuclear magnetic resonance, a device comprising two sets of identical brackets, distributed and fastened radially by their struts, on either side of the magnet, to end rings of the magnet tube, each bracket being provided, on its arm, with means for putting the mandrel under stress.

BRIEF DESCRIPTION OF THE DRAWINGS

The invention will be better understood from the following description and the appended figures, given by way of a non-exhaustive indication. In the figures, the same references designate the same elements. These figures are:

FIG. 1, a schematic depiction of the architecture of the means used in a nuclear magnetic resonance imaging device, according to the invention;

FIG. 2, a detailed section drawing of a part of a device according to the invention;

FIG. 3, a front view, along a direction D of FIG. 2, of a bracket of the fastening device according to the invention.

DESCRIPTION OF THE PREFERRED EMBODIMENT OF THE INVENTION

FIG. 1 is a schematic diametral section drawing of a nuclear magnetic resonance imaging device. The following parts are positioned, around an axis of revolution 1, from the outside to the inside: a magnet 2 producing the orienting field $B_0$, the set 3 of shim coils, a gradient mandrel 4, a screen 5 and the radio-frequency antenna 6. The functional links which organize the working of these various means are not depicted: they do not relate to the invention. To hold the mandrel 4, the fastening device of the invention has two sets 7-8 and 9-10 of identical brackets fastened to the end rings, 11 and 12 respectively, on either side of the magnet 2. Of course the sets 7-8 and 9-10 do not contain solely the two brackets depicted. They may contain several of these brackets. In a preferred example, they each contain six brackets, distributed in a circle on the rings.

FIG. 2 gives a detailed view of how the brackets are fastened to the end rings of the magnet. The struts of these brackets, for example the strut 13 of the bracket 7, is pointed radially. It rises towards the interior of the magnet in the direction of the axis 1. The arm 14 of the bracket then comprsies a device designed to exert a radial stress on the gradient mandrel 4. In the present case, the stress is a compressive stress. It can be seen that the presence of the brackets makes the fastening of the mandrel 4 to the magnet 2 independent of the fastening (depicted schematically under reference 15) of the shim coils to the magnet.

The means 14 for putting the gradient mandrel under stress comprise, for each bracket, a skid 16 drawn by an end of a threaded rod 17. The rod 17 is held fixed in rotation in relation to the strut of the bracket. For example, the threaded rod 17 forms one piece with a skid-holder 18, of which one of the flat side surfaces 19 leans on a facing flat surface 20 of the strut 13: this stops it from rotating. However, the threaded rod can be shifted in the direction of the axis 1 by the sliding of the surface 19 on the surface 20. For this purpose, the threaded rod 17 is engaged in a threaded control roller 21. This roller freely rotates on the axis 22 of the rod 17, but is held during travel by a slot 23 made in the strut 13. The protruding feature comprising the rod 17 and the skid 16 forms the arm of the bracket 7. The roller 21 is held radially with respect to the magnet in the slot 23 through the presence of a slot 25 on the other side in a returning part of the strut which is joined with the strut 13. The strut returning part 24 is fastened by any means to the strut 13, and preferably forms one piece with it. It is joined to it by linking pieces such as 26. In the strut returning part 24, the slot 25 has dimensions equal to the slot 23 in the strut 13. The roller 21 then leans by its circular plane surfaces on the edges of the slots. By reaction, it can pull the threaded rod 17 along when it is operated. In one example, the thread pitch of the threaded rod 17 is equal to 0.5 mm. With each full turn of the roller, the threaded rod 17 is thus shifted by a radial height equal to this pitch. So as to provide for the easy handling of the roller and so as to quantify the displacement of the rod in sub-multiples of the pitch, the roller 21 is provided with holes such as 27 and 28, evenly distributed on its rim. The end of a control rod can be engaged in these holes and exert a torque to make the roller rotate. In a preferred manner, the width L (FIG. 3) of the slot 23 of the strut 7 is sufficient to make it possible to see at least two holes when one of these holes is near one of the side surfaces of the slot.

The sizes of the magnets manufactured by various manufacturers of magnets vary to within a few centimeters of one another, although they have common internal dimensions. To allow for these variations, the struts of the brackets are each provided with an oblong hole 30 so that the bracket has a slight heightwise clearance. The result of this is that the dimension of the fastening of the bracket 7 by a bolt 31 in the ring 11 does not depend on the variation of the position of the receiving thread made by the manufacturer of the magnet in the end ring 11. However, so as to make this end ring keep its proposed nature of a reference piece, it is planned to provide the bracket with a heel 32 fastneed to the strut of the bracket so as to form, with this strut, an angular container in which the reference surfaces 33 and 34 of the ring 11 are interleaved.

To allow for the respective space factors of the various parts of the instrument, a set of spacing shims such as 35 may be placed between the strut 13 and the ring 11. The heel 32 is then fastened to a shim 36 which directly leans on the ring 11.

The proposed assembly of the roller (provided with its threaded rod to which the skid is hooked) in the strut of the bracket gives an advantage. For it is possible, by taking identical rollers and identical threaded rods to assemble them in such a way that the skids are all at an equal distance from their roller. To this end, the rollers are inserted into their respective slots (i.e. inserted through the slot). The threaded rods are screwed in until the skid-holders 18 abut the strut and the strut returning part. Then, by equal numbers of turns, all the skids of a set are shited. The result of this is that when the rollers thus assembled are placed in the struts, the distance between the skid 16 and the heel 32 is identical for all the brackets: the adjusting reference piece is shifted. The positioning and adjusting of the mandrel is consequently made much easier: it is enough to turn all the rollers of each set by the same number of turns or fraction of turns. The setting precision depends on the precision with which the reference surfaces 33 and 34 are made.

Finally, in the invention, the brackets can be each provided with a removable tip such as the tip 37 of the bracket 7. The tip 37 is, for example, fastened to the end of the brackets 7 by means of a screw 38. During the installation, the mandrel 4 is secured lengthwise by making one of its ends abut the tip 37. Finally, the surface 39, turned towards the inside of the instrument, of the tip 37, is the reference surface 33 of the ring 11 in its translated position. As soon as the rollers 21 have been actuated to put the mandrel 4 under stress, the tips 37 can be removed so as to limit the transmission of vibrations from the mandrel 4 to the bracket. This limits the noise while at the same time also giving the rigidity of a firm reference piece. The reduction of the vibrations and their effects is therefore quite compatible with positioning precision in the invention.

Furthermore, the mandrel 4 is preferably of the single-piece type. This means that the gradient coils installed in it are joined to it as continuously as possible. In particular, the fastening of these coils is combined with a duplicate moulding of the mandrel in polymerizable resin. After polymerization, the entire, single-piece mandrel 4 is more particularly liable to oscillate between its supports (on either side of the magnet) at an inherent frequency. The dampening material of the skids 16 is preferably calculated to dampen vibrations at this frequency. This is not possible in the state of the art referred to, where the mandrel (which, besides, is not in one piece) emits a broad spectrum of vibrations which are difficult to dampen. This problem is even more critical if the mechanical resonator that it constitutes is coupled with another resonator, namely the shim coils, and if they mechanically excite the magnet in common. In one example the skids 16 are made of rubber.

What is claimed is:

1. Device for fastening and adjusting a gradient-coil-holding mandrel inside a broadly tube-shaped magnet of an instrument for measuring nuclear magnetic resonance, said device comprising two sets of identical brackets on either side of the magnet tube, each said bracket having a radially extending strut fastened to end rings of the magnet tube, each said bracket having an arm provided with means for applying stress to the mandrel, wherein the means for applying stress comprise a skid drawn by a threaded rod which is fastened in rotation and a control roller fastened in travel with respect to the bracket to move the threaded rod radially with respect to the tube.

2. Device according to claim 1, wherein the means for applying stress comprise means to exert a stress directed towards the interior of the mandrel.

3. Device according to claim 1, wherein the skids comprise a rubber part in contact with the mandrel.

4. Device according to any one of the claims 1 to 2, wherein the struts of the brackets all comprise a heel placed at one and the same place on the strut, leaning against an inner surface of the magnet tube, and an oblong opening in the strut to facilitate the fastening of the bracket to the end ring in keeping with manufactured product differences.

5. Device according to any one of the claims 1 to 2, wherein the struts of the brackets are fastened to the end of the tube by means of spacing shims.

6. Device according to any one of the claims 1 to 2, wherein each set of brackets comprises 6 brackets, evenly distributed on each ring.

7. Device according to any one of the claims 1 to 2, wherein the magnet comprises a gradient mandrel made in one piece.

8. Device for fastening and adjusting a gradient-coil-holding mandrel inside a broadly tube-shaped magnet of an instrument for measuring nuclear magnetic resonance, said device comprising two sets of identical brackets on either side of the magnet tube, each said bracket having a radially extending strut fastened to end rings of the magnet tube, each said bracket having an arm provided with means for applying stress to the mandrel, wherein the bracket struts each further comprise a removable tip which extends beyond the bracket to act as a longitudinal adjusting stop for the mandrel, whereby noise is reduced.

* * * * *